(12) United States Patent
Laschek-Enders (10) Patent No.: US 9,912,331 B2
(45) Date of Patent: Mar. 6, 2018

(54) GATE DRIVER THAT DRIVES WITH A SEQUENCE OF GATE RESISTANCES

(71) Applicant: IXYS Corporation, Milpitas, CA (US)

(72) Inventor: Andreas Laschek-Enders, Bensheim (DE)

(73) Assignee: IXYS Corporation, Milpitas, CA (US)

( * ) Notice: Subject to any disclaimer, the term of this patent is extended or adjusted under 35 U.S.C. 154(b) by 0 days.

(21) Appl. No.: 15/686,161

(22) Filed: Aug. 25, 2017

(65) Prior Publication Data

US 2017/0373682 A1 Dec. 28, 2017

Related U.S. Application Data

(63) Continuation of application No. 15/088,124, filed on Apr. 1, 2016, now Pat. No. 9,813,055.

(51) Int. Cl.
*H03K 3/00* (2006.01)
*H03K 17/567* (2006.01)
*H03K 5/14* (2014.01)
*H03K 17/687* (2006.01)
*H01L 27/06* (2006.01)
*H01L 29/739* (2006.01)
*H03K 5/00* (2006.01)

(52) U.S. Cl.
CPC ....... *H03K 17/567* (2013.01); *H01L 27/0629* (2013.01); *H01L 27/0647* (2013.01); *H01L 29/7393* (2013.01); *H03K 5/14* (2013.01); *H03K 17/687* (2013.01); *H03K 2005/00058* (2013.01)

(58) Field of Classification Search
None
See application file for complete search history.

(56) References Cited

U.S. PATENT DOCUMENTS

| | | | | |
|---|---|---|---|---|
| 6,127,746 A | 10/2000 | Clemente | ............... | H03K 17/00 307/131 |
| 6,208,185 B1 | 3/2001 | John et al. | ............... | H03K 5/12 327/170 |
| 6,429,701 B2 | 8/2002 | Karaki et al. | ............ | H03K 3/00 327/110 |
| 8,080,988 B2 | 12/2011 | Hurtz et al. | ............ | G05F 1/613 323/289 |
| 8,222,846 B2 * | 7/2012 | Sugie | ...................... | H02P 6/085 318/379 |

(Continued)

*Primary Examiner* — Lincoln Donovan
*Assistant Examiner* — Khareem E Almo
(74) *Attorney, Agent, or Firm* — Imperium Patent Works; T. Lester Wallace (57) ABSTRACT

A gate driver integrated circuit for driving a gate of an IGBT or MOSFET receives an input signal. In response to a rising edge of the input signal, the integrated circuit causes the gate to be driven in a first sequence of time periods. In each period, the gate is driven high (pulled up) via a corresponding one of a plurality of different effective gate resistances. In response to a falling edge of the input signal, the integrated circuit causes the gate to be driven in a second sequence of time periods. In each period, the gate is driven low (pulled down) via a corresponding one of the different effective gate resistances. In one example, the duration of each time period is set by a corresponding external passive circuit component. The different effective gate resistances are set by external gate resistors disposed between the integrated circuit and the gate.

20 Claims, 7 Drawing Sheets

(56) References Cited

U.S. PATENT DOCUMENTS

| | | | |
|---|---|---|---|
| 2006/0017466 A1* | 1/2006 | Bryson | H03F 3/2171 326/88 |
| 2007/0085133 A1* | 4/2007 | Kirchmeier | H01S 3/097 257/321 |
| 2013/0249602 A1* | 9/2013 | Mauder | H01L 27/0629 327/108 |
| 2014/0062558 A1* | 3/2014 | Kinjou | H03K 5/12 327/170 |
| 2015/0048718 A1* | 2/2015 | Etzler | F02D 41/2096 310/318 |
| 2015/0061461 A1* | 3/2015 | Schrod | F02D 41/2096 310/316.03 |
| 2015/0318848 A1* | 11/2015 | Kandah | H02M 1/32 363/132 |
| 2016/0087626 A1* | 3/2016 | Kaeriyama | H03K 17/687 327/109 |
| 2016/0163615 A1* | 6/2016 | Mitamura | H01L 27/0664 257/140 |

\* cited by examiner

ONE PHASE LEG
(PRIOR ART)
FIG. 1

ONE PHASE LEG

GATE DRIVER THAT DRIVES WITH A SEQUENCE OF GATE RESISTANCES

CROSS REFERENCE TO RELATED APPLICATIONS

This application is a continuation of, and claims priority under 35 U.S.C. §120 from, nonprovisional U.S. patent application Ser. No. 15/088,124 entitled "High-Voltage Stacked Transistor Circuit," filed on Apr. 1, 2016, now U.S. Pat. No. 9,813,055, the subject matter of which is incorporated herein by reference.

TECHNICAL FIELD

The described embodiments relate to gate driver circuits for driving power transistors, more particularly to gate driver circuits for driving insulated gate bipolar transistors (IGBT) and power field effect transistors (MOSFET).

BACKGROUND INFORMATION

Figure 1:
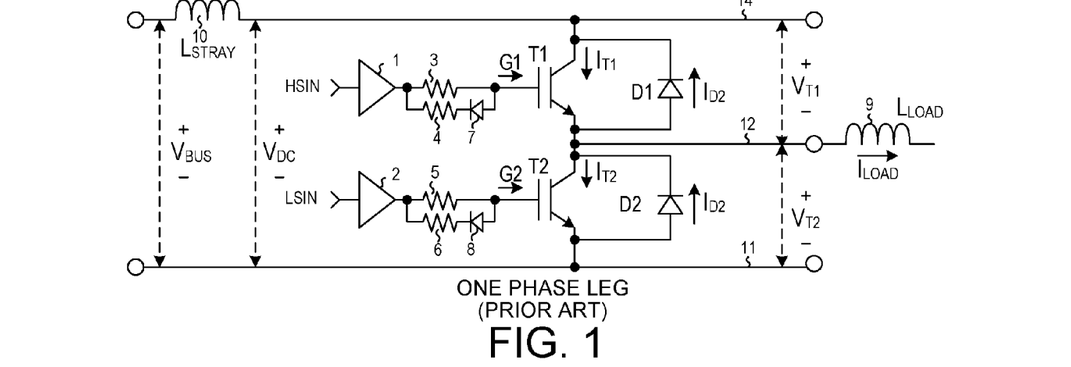
FIG. 1 (Prior Art) is a diagram of a prior art phase leg circuit.
Figure 2A:
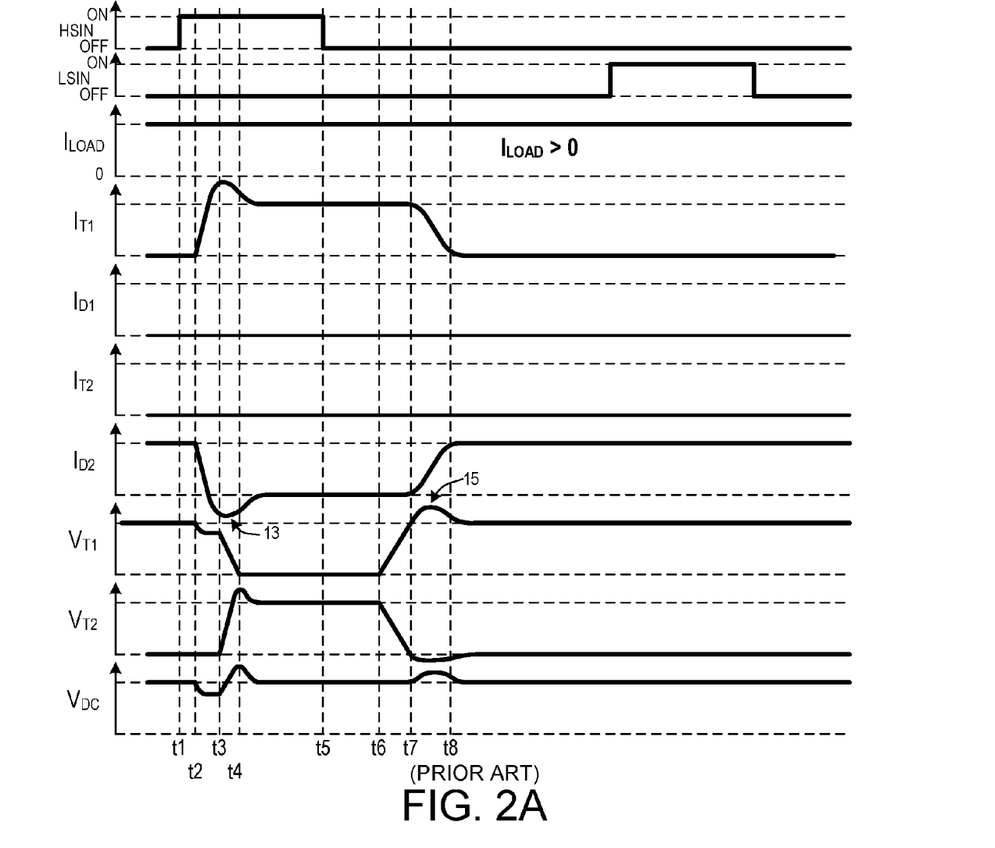
FIG. 2A (Prior Art) is a waveform diagram of voltages and currents in the prior art phase leg circuit of FIG. 1 for a situation in which the load current $I_{LOAD}$ is positive.
Figure 2B:
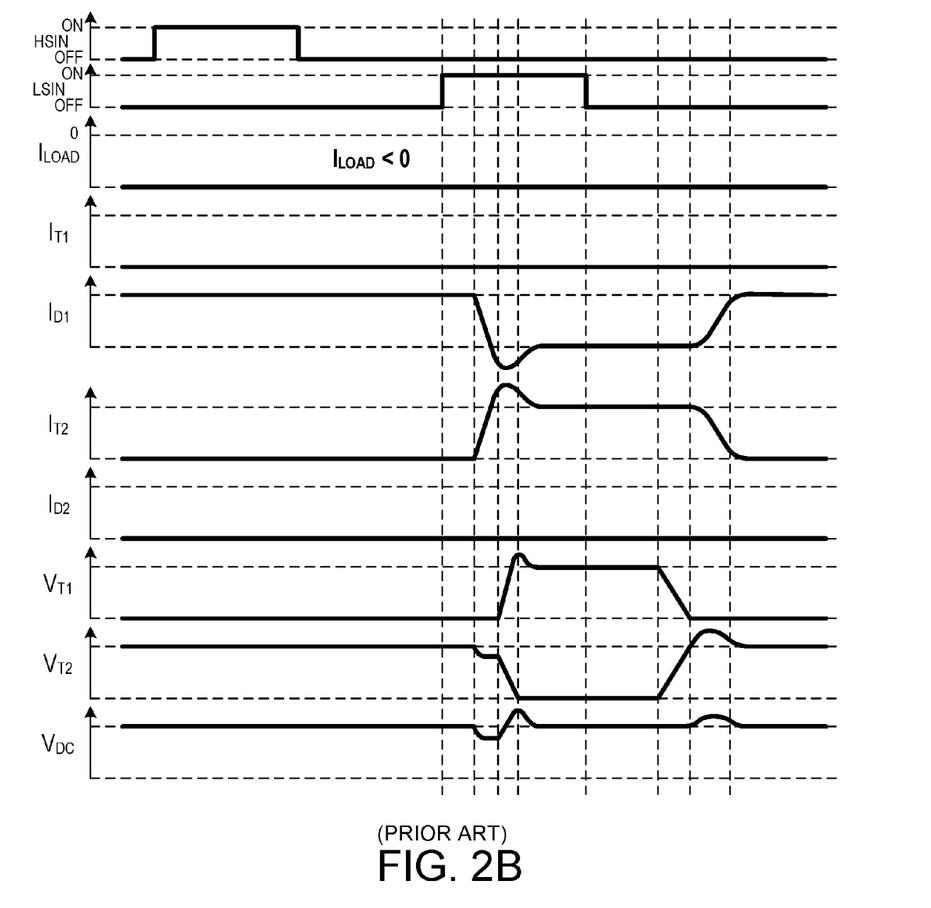
FIG. 2B (Prior Art) is a waveform diagram of voltages and currents in the prior art phase leg circuit of FIG. 1 for a situation in which the load current $I_{LOAD}$ is negative.

FIG. 1 (Prior Art) is a diagram of a phase leg involving two Insulated Gate Bipolar Transistors (IGBTs) T1 and T2, two power diodes D1 and D2, two gate drivers 1 and 2, gate resistors 3-6 and diodes 7 and 8. The inductor symbol 9 represents a large inductive load. The inductor symbol 10 represents inductance in the power supply and ground lines. FIG. 2A (Prior Art) is a waveform diagram of voltages and currents in the circuit of FIG. 1 for a situation in which the load current $I_{LOAD}$ is positive. FIG. 2B (Prior Art) is a waveform diagram for a situation in which the load current $I_{LOAD}$ is negative. The gate resistors are provided to slow down the turn on and the turn off of the IGBTs.

Assume first a condition in which T1 is off. Current is flowing from node 11, through the low-side power diode D2, to node 12, and out through inductive load 9. At time t1, the gate signal G1 transitions from low to high. At time t2, T1 begins to conduct current. As the current $I_{T1}$ increases, the diode current $I_{D2}$ in the low-side power diode D2 decreases. Diode D2 then goes into reverse recovery. This reverse recovery is evidenced in a current undershoot 13. If the dI/dt change in diode current $I_{D2}$ through diode D2 is too large during this time, then diode D2 can be damaged or may fail. To avoid this, gate resistor 3 is provided. Gate resistor 3 increases the resistance between the driver 1 and the gate of T1. The gate resistor limits dI/dt through T1 when T1 is turning on, and therefore also limits dI/dt in the diode D2 between times t2 and t3. Starting at time t3, which is approximately when reverse recovery peak 13 is at its maximum, the voltage $V_{T1}$ across transistor T1 can change. From time t3 to time t4, the voltage across T1 decreases. The rate of this voltage decrease is dV/dt. In many modern IGBT devices, the influence of the gate resistance on this dV/dt across the IGBT is weak. Increasing the gate resistance has only a slight effect in decreasing the dV/dt. In high voltage phase legs, a large dV/dt can cause problems such as EMI problems. Other devices on the printed circuit board can also be adversely affected by the high dV/dt. A larger gate resistance may be provided to reduce the dV/dt to acceptable levels, but then the dI/dt of the transistor at turn on between times t2 and t3 is lower than it otherwise could be. Turning on transistor T1 with too small of an dI/dt generally results in switching losses. If the increased switching losses cannot be tolerated, then a smaller gate resistance is used and other possibly expensive and cumbersome techniques are applied to deal with the dV/dt problem.

When an IGBT in a phase leg is turned off, there is also a change in voltage across the transistor and a change in current. In the circuit of FIG. 1, assume transistor T1 is conducting. Current is flowing from node 14, through T1, to node 12, and out through the inductive load 9. Then at time t5 the gate signal G1 transitions from high to low. When the gate signal G1 transitions low, the transistor T1 does not actually turn off immediately. It takes time within the transistor for the gate to be discharged to the point that the gate voltage reaches the threshold voltage. Once the voltage on the gate decreases below the threshold voltage, then the resistance through the IGBT increases. Due to current flow through T1, the voltage drop across the transistor increases. At time t6, the voltage $V_{T1}$ across T1 in FIG. 2A increases. When voltage crosses the supply voltage $V_{DC}$ at time t7, current begins to commutate to diode D2. The current $I_{T1}$ drops, and the current $I_{D2}$ increases resulting in a voltage overshoot of the supply voltage $V_{DC}$ and $V_{T1}$. Reference numeral 15 identifies this voltage overshoot. This is manifest as a negative dI/dt in the $I_{T1}$ waveform. A circuit designer may want to wave shape this falling signal edge of the $I_{T1}$ current, but the influence of the gate resistance on this dI/dt of transistor turn off is small. A very large gate resistance that is large enough to slow this negative dI/dt cannot generally be used, because such a large gate resistance might increase the delay period between times t5 and t6 too much.

The phase leg circuit of FIG. 1 includes a common gate resistance circuit involving a resistor and a parallel path of a resistor and a series diode. This gate resistance circuit provides a first gate resistance for turn on and a second gate resistance for turn off. In transistor turn off situations, where the gate driver 1 is outputting a low voltage as compared to the higher voltage on the gate of T1, diode 7 is forward biased. The effective resistance between the gate driver 1 and the gate of transistor T1 is the parallel combination of the resistances of resistors 3 and 4. In transistor turn on situations, where the gate driver 1 is outputting a high voltage as compared to the lower voltage on the gate of T1, diode 7 is reverse biased. The effective resistance between the gate driver 1 and the gate of transistor T1 is the resistance of resistor 3. This gate resistance circuit allows different turn on and turn off gate resistances to be used.

SUMMARY

In a first novel aspect, a gate driver integrated circuit for driving the gate of a power semiconductor device, such as an Insulated Gate Bipolar Transistor (IGBT) or a power field effect transistor (MOSFET), receives a digital input signal. In response to a rising edge of the digital input signal, the gate driver integrated circuit causes the gate to be driven with a high voltage in a first sequence of time periods. In each of these time periods, the gate is driven (pulled up) to the high voltage source through a corresponding one of a plurality of different effective gate resistances. In response to a falling edge of the digital input signal, the gate driver integrated circuit causes the gate to be driven to a low voltage in a second sequence of time periods. In each of these time periods, the gate is driven (pulled down) to the low voltage source through a corresponding one of the different effective gate resistances. In one example, the duration of each of the plurality of time periods is set by a corresponding respective one of a plurality of external passive circuit components. These external passive circuit components may, for example, be external capacitors. The various different effective gate resistances through which the gate driver integrated circuit drives the gate are set by a set of external gate resistors disposed between gate drivers in the gate driver integrated circuit and the gate of the transistor.

In a second novel aspect, a gate driver integrated circuit has a digital serial bus interface through which it communicates with a microcontroller. Via this bus, the microcontroller can write to a set of internal digital control registers within the gate driver integrated circuit. The value in a first control register sets the first predetermined order to be one of a plurality of selectable orders, and another value in a second control register sets the second predetermined order to be one of the plurality of selectable orders. The number of buffers in the delay lines of the control circuit is increased, and the corresponding larger number of delay set capacitors is packaged in the semiconductor device package along with the integrated circuit itself. The microcontroller can then over time fine tune and modify how the gate driver integrated circuit drives the IGBT as the larger phase leg circuit of which the IGBT is a part operates.

Further structures and methods are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to embodiments of the invention, examples of which are illustrated in the accompanying drawings.

Figure 3:
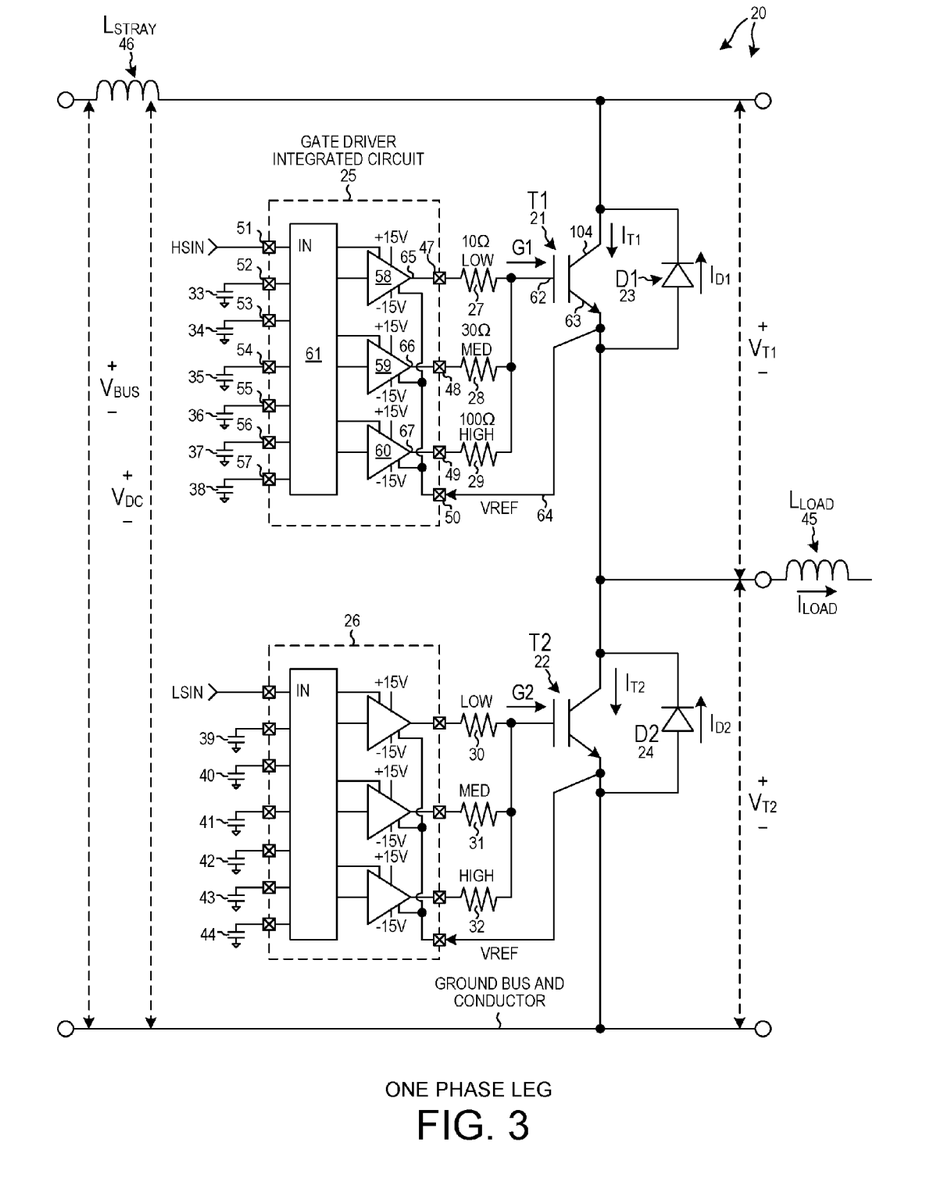
FIG. 3 is a simplified circuit diagram of a phase leg circuit that employs a novel gate driver integrated circuit in accordance with one novel aspect.

FIG. 3 is a simplified circuit diagram of a phase leg circuit 20 in accordance with one novel aspect. Circuit 20 includes two IGBTs T1 21 and T2 22, two power diodes D1 23 and D2 24, two novel gate driver integrated circuits 25 and 26, gate resistors 27-32, and Delay Set (DS) timing capacitors 33-44. The inductor symbol 45 represents a large inductive load. The inductor symbol 46 represents inductance in the power supply and ground lines. The integrated circuits 25 and 26 are of identical construction, so only integrated circuit 25 is described in further detail below. Integrated circuit 25 includes three output terminals 47-49, a reference voltage input terminal 50, a signal input terminal IN 51, and six Delay Set (DS) terminals 52-57. In addition, integrated circuit 25 includes three gate drivers 58-60 and a driver control circuit 61. A power supply circuit (not shown) supplies the +15 volts and −15 volt supply voltages that power the gate drivers 58-60. Gate resistor 27 resistively couples output terminal 47 of integrated circuit 25 to the gate electrode and lead 62 of transistor T1. Gate resistor 28 resistively couples output terminal 48 of integrated circuit 25 to the gate electrode and lead 62 of transistor T1. Gate resistor 29 resistively couples output terminal 49 of integrated circuit 25 to the gate electrode and lead 62 of transistor T1. The voltage on the emitter electrode and lead 63 of transistor T1 is coupled via conductor 64 to the reference voltage input terminal 50 of integrated circuit 25.

In operation, gate driver integrated circuit 25 receives a digital input signal (also called a gate driver control input signal) HSIN via input terminal IN 51. In response to a rising edge of this digital input signal HSIN, the gate driver integrated circuit 25 enables the first, second and third gate drivers 58, 59 and 60 sequentially in a first predetermined order. In the present example, the first predetermined order is gate driver 58, gate driver 59, gate driver 60, gate driver 58. Each of the three gate drivers when enabled in response to the rising edge drives a "high voltage" onto its output lead. The output lead of gate driver 58 is identified by reference numeral 65. The output lead of gate driver 59 is identified by reference numeral 66. The output lead of gate driver 60 is identified by reference numeral 67. This "high voltage" that is output onto the driver output lead is relative to the reference voltage on the terminal 50 of the integrated circuit. The gate drivers are of the floating reference potential type. In the present example, the "high voltage" output by a gate driver is 15 volts higher than the voltage on terminal 50.

In response to a falling edge of the digital input signal HSIN, the gate driver integrated circuit 25 enables the first, second and third gate drivers sequentially in a second predetermined order. In the present example, the second predetermined order is gate driver 58, gate driver 60, gate driver 59, gate driver 58. Each of the three gate drivers when enabled in response to the falling edge drives a "low voltage" onto its output lead. This "low voltage" that is output onto the driver output lead is relative to the reference voltage on the terminal 50 of the integrated circuit. In the present example, the low voltage is 15 volts lower than the voltage on terminal 50.

Figure 4A:
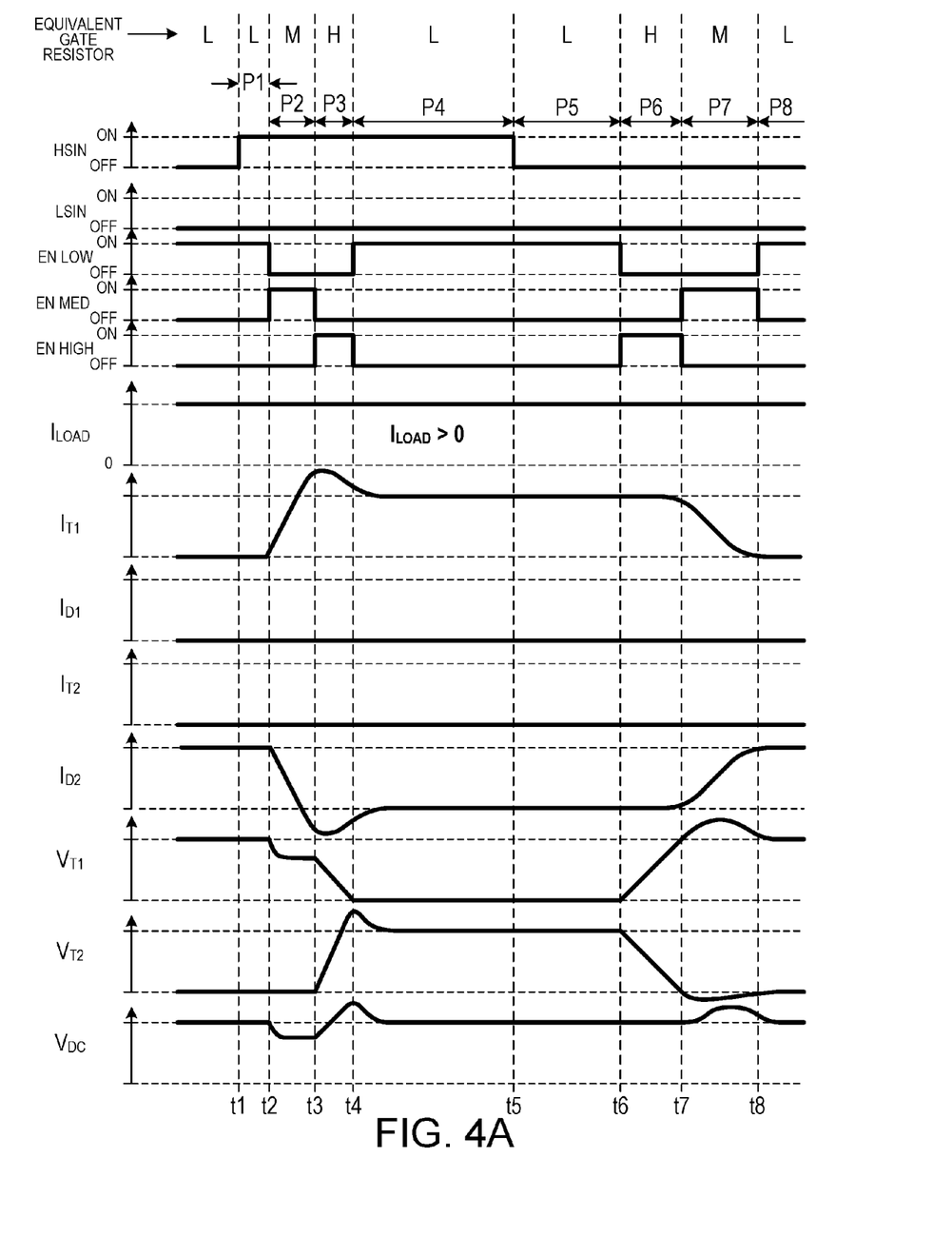
FIG. 4A is a waveform diagram that illustrates voltages and currents in the circuit of FIG. 3 for a situation in which the load current $I_{LOAD}$ is positive.

FIG. 4A is a simplified waveform diagram that illustrates voltages and currents in the circuit of FIG. 3 for a situation in which the load current $I_{LOAD}$ is positive.

Figure 4B:
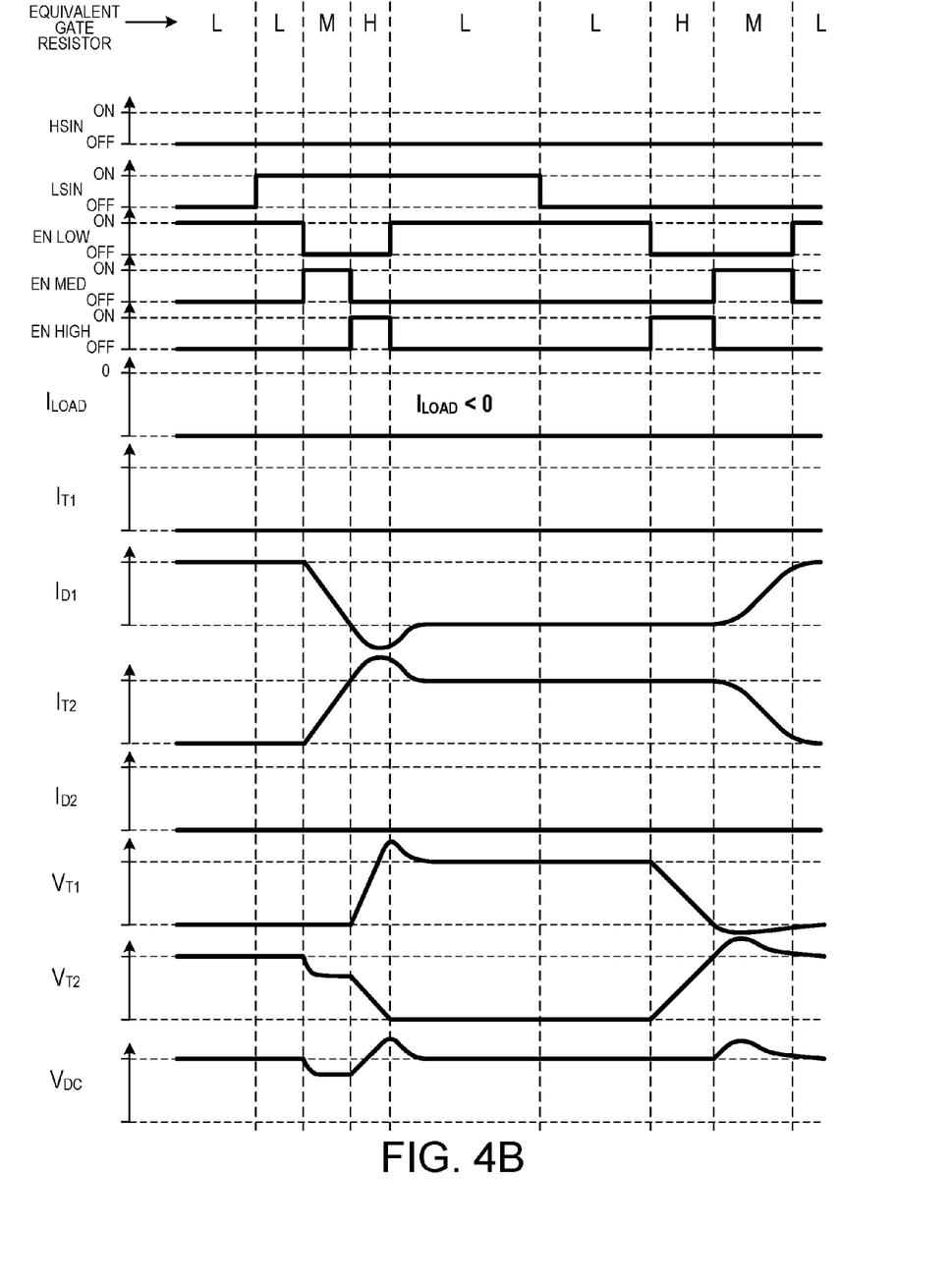
FIG. 4B is a waveform diagram that illustrates voltages and currents in the circuit of FIG. 3 for a situation in which the load current $I_{LOAD}$ is negative.

FIG. 4B is a simplified waveform diagram that illustrates voltages and currents in the circuit of FIG. 3 for a situation in which the load current $I_{LOAD}$ is negative.

In the waveform diagram of FIG. 4A, at time t1 the incoming digital gate driver control input signal HSIN transitions from low to high. This low-to-high transition is a so-called "rising edge" of the input signal HSIN. In response to the rising edge, for a period of time P1 starting at time t1, integrated circuit 25 keeps gate driver 58 enabled such that gate driver 58 switches and drives a high voltage onto its output lead 65. During this time period P1, gate driver 58 is enabled and the other two gate drivers 59 and 60 are disabled. The effective gate resistance with which the gate electrode of the transistor T1 is driven is the resistance of gate resistor 27. The duration of time period P1 is set by the magnitude of timing capacitor 33. Timing capacitor 33 is sized so that time period P1 ends where illustrated in the waveform diagram at time t2. This time t2 is the point in time when the current $I_{T1}$ begins to increase due to T1 turning on. Current $I_{T1}$ is the collector current flowing into the collector electrode and lead 104.

Next, and also in response to the rising edge of HSIN, for a period of time P2 starting at time t2, integrated circuit 25 disables gate driver 58 and enables gate driver 59 such that gate driver 59 drives a high voltage onto its output lead 66. During this time period P2, the other two gate drivers 58 and 60 are disabled. The effective gate resistance with which the gate electrode of the transistor T1 is driven is the resistance of gate resistor 28. The duration of time period P2 is set by the magnitude of timing capacitor 34. Timing capacitor 34 is sized so that time period P2 ends where illustrated in the waveform diagram at time t3. This time t3 is the point in time when the voltage $V_{T1}$ across the transistor T1 begins to decrease as a result of transistor T1 turning on and is identical with $I_{D2}$ reverse recovery peak of diode D2.

Next, and also in response to the rising edge of HSIN, for a period of time P3 starting at time t3, integrated circuit 25 disables gate driver 59 and enables gate driver 60 such that gate driver 60 drives a high voltage onto its output lead 67. During this time period P3, the other two gate drivers 58 and 59 are disabled. The effective gate resistance with which the gate electrode of the transistor T1 is driven is the resistance of gate resistor 29. The duration of time period P3 is set by the magnitude of timing capacitor 35. Timing capacitor 35 is sized so that time period P3 ends where illustrated in the waveform diagram at time t4. This time t4 is the point in time when the voltage $V_{T1}$ across the transistor T1 reaches its minimum of about zero and stabilizes at $V_{CEsat}$ due to transistor T1 having turned on.

Next, and also in response to the same rising edge of HSIN, and starting at time t4, integrated circuit 25 disables gate driver 60 and enables gate driver 58 again such that gate driver 58 drives a high voltage onto its output lead 65. The other two gate drivers 59 and 60 are disabled. The effective gate resistance with which the gate electrode of the transistor T1 is driven is the resistance of gate resistor 27. Gate driver 58 remains enabled and driving out the high voltage as long as the incoming digital input signal HSIN remains at the high logic level.

Accordingly, in response to a low-to-high transition of the incoming digital signal HSIN, the integrated circuit 25 drives the gate of transistor T1 for a first period of time P1 using gate resistor 27, then drives the gate for a second period of time P2 using gate resistor 28, then drives the gate for a third period of time P3 using gate resistor 29, and then drives the gate using gate resistor 27 for the next while as long as the input signal HSIN remains at the high logic level. The capacitance of timing capacitor 33 is selected such that the time period P1 is the time period from the rising edge of the incoming signal HSIN until transistor T1 begins to conduct current. The capacitance of timing capacitor 34 is selected such that the time period P2 is the time period from the time T2 when transistor T1 starts to conduct current until time t3 when the voltage across transistor T1 begins to fall. The capacitance of timing capacitor 35 is selected such that the time period P3 is the time period from the time t3 when the voltage across transistor T1 begins to fall until time t4 when the voltage across transistor T1 reaches its minimum and stabilizes there.

In the waveform example of FIG. 4A, the logic level of the incoming input signal HSIN remains at the high logic level for a time until time t5. At time t5, the input signal HSIN transitions from high to low. This high-to-low transition is a so-called "falling edge" of the input signal HSIN.

In response to the falling edge, for a period of time P5 starting at time t5, integrated circuit 25 keeps gate driver 58 enabled. The input signal HSIN, however, transitioned from a high logic level to a low logic level, so the gate driver 58 switches and starts driving a low voltage onto its output lead 65. During this time period P5, gate driver 58 is enabled and the other two gate drivers 59 and 60 remain disabled. The effective gate resistance with which the gate electrode of the transistor T1 is driven is the resistance of gate resistor 27. The duration of time period P5 is set by the magnitude of timing capacitor 36. Timing capacitor 36 is sized so that time period P5 ends where illustrated in the waveform diagram.

Next, and also in response to the same falling edge of HSIN, for a period of time P6 starting at time t6, integrated circuit 25 disables gate driver 58 and enables gate driver 60 such that gate driver 60 drives a low voltage onto its output lead 67. During this time period P6, the other two gate drivers 58 and 59 are disabled. The effective gate resistance with which the gate electrode of the transistor T1 is driven is the resistance of gate resistor 29. The duration of time period P6 is set by the magnitude of timing capacitor 37. Timing capacitor 37 is sized so that time period P6 ends where illustrated in the waveform diagram at time t7. This time t7 is the point in time when the current $I_{T1}$ flowing through the transistor T1 begins to decrease due to T1 being turned off and the voltage across T1 has reached the supply voltage $V_{DC}$.

Next, and also in response to the falling edge of HSIN, for a period of time P7 starting at time t7, integrated circuit 25 disables gate driver 60 and enables gate driver 59 such that gate driver 59 drives a low voltage onto its output lead 66. During this time period P7, the other two gate drivers 58 and 60 are disabled. The effective gate resistance with which the gate electrode of the transistor T1 is driven is the resistance of gate resistor 28. The duration of time period P7 is set by the magnitude of timing capacitor 38. Timing capacitor 38 is sized so that time period P7 ends where illustrated in the waveform diagram at time t8. This time t8 is the point in time when the current $I_{T1}$ flowing through the transistor T1 reaches zero and stabilizes at zero.

Next, and also in response to the falling edge of HSIN, and starting at time t8, integrated circuit 25 disables gate driver 59 and enables gate driver 58 such that gate driver 58 drives a low voltage onto its output lead 65. The other two gate drivers 59 and 60 are disabled. The effective gate resistance with which the gate electrode of the transistor T1 is driven is the resistance of gate resistor 27. Gate driver 58 remains enabled and driving out the low voltage as long as the incoming input signal HSIN remains at the low logic level.

Accordingly, in response to a high-to-low transition of the incoming signal HSIN, the integrated circuit 25 drives the gate of transistor T1 for a first period of time P5 using gate resistor 27, then drives the gate for a second period of time P6 using gate resistor 29, then drives the gate for a third period of time P7 using gate resistor 28, and then drives the gate using gate resistor 27 for the next while as long as the signal HSIN remains low. This second predetermined sequence of turning on gate drivers used in response to high-to-low transitions of the input signal HSIN is different than the first predetermined sequence of turning on gate drivers used in response to low-to-high transitions of the input signal HSIN. The capacitance of timing capacitor 36 is selected such that the time period P5 is the time period from the falling edge of the incoming signal HSIN until the voltage across transistor T1 begins to increase. The capacitance of timing capacitor 37 is selected such that the time period P6 is the time period from the time t6 when the voltage across transistor T1 starts to increase until time t7 when current flow through transistor T1 begins to decrease due to transistor T1 being turned off and the voltage across T1 has reached the supply voltage $V_{DC}$. The capacitance of timing capacitor 38 is selected such that the time period P7 is the time period from the time t7 when transistor T1 begins to conduct until time t8 when current flow through transistor T1 stops due to transistor T1 being turned off.

Figure 5:
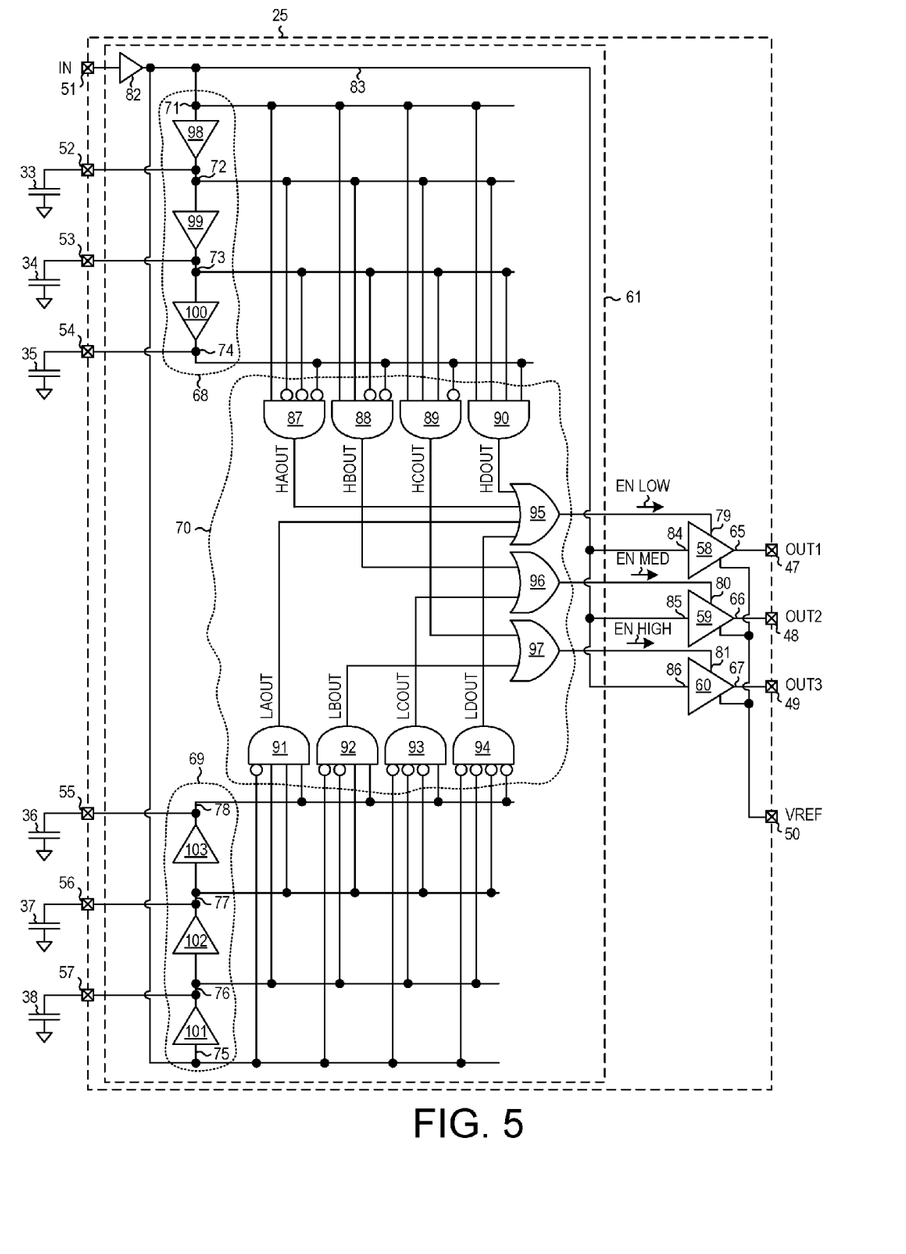
FIG. 5 is a circuit diagram of one specific embodiment of the novel gate driver integrated circuit of FIG. 3.

FIG. 5 is a circuit diagram of one specific embodiment of integrated circuit 25 of FIG. 3. Driver control circuit 61 includes a first digital delay line 68 made of digital buffers, a second digital delay line 69 made of digital buffers, and an amount of digital logic 70. First delay line 68 includes non-inverting delay buffers 98-100. Second delay line 69 includes non-inverting delay buffers 101-103. The digital logic 70 is coupled to receive signals from the plurality of nodes 71-74 of the first delay line 68 and is coupled to receive signals from the plurality of nodes 75-78 of the second delay line 69. Based on these node signals, digital logic 70 supplies a first active-high enable signal EN LOW onto to enable input lead 79 of gate driver 58, supplies a second active-high enable signal EN MED onto the enable input lead 80 of the gate driver 59, and supplies a third active-high enable signal EN HIGH onto the enable input lead 81 of gate driver 60. The input signal HSIN that is received onto input terminal IN 51 as buffered by input buffer 82 is supplied via conductor 83 onto the input leads 84-86 of gate drivers 58-60.

If the input signal HSIN on input terminal IN 51 is low and stable for a long period of time, a digital logic low signal is present on all the nodes 71-74 of the first delay line 68, and on all the nodes 75-78 of the second delay line 69. The digital logic low signal on node 71 is supplied onto an input lead of each of the AND gates 87-90. Each of these AND gates 87-90 outputs a digital logic low signal. Also, the digital logic low signal on node 75 (node 75 is the same node as node 71) is supplied onto an input lead of each of the AND gates 91-94. Each of these three AND gates 91-93 outputs a digital logic low signal, but AND gate 94 detects the condition of all delay line nodes being low and outputs a digital logic high signal. As a result of the AND gates outputting their signals, OR gate 95 outputs a digital logic high signal, and OR gates 96 and 97 output digital logic low signals. Accordingly, gate driver 58 is enabled, and gate drivers 59 and 60 are disabled.

Next, the input signal HSIN transitions high, AND gate 94 switches and outputs a digital logic low signal. The signals on the internal nodes 76, 77 and 78 of the second delay line 69 have not transitioned high yet, so the digital logic low signals on these nodes are supplied onto inputs of AND gates 91-93. AND gates 91-93 therefore continue to output digital logic low signals.

The low-to-high transition of the input signal HSIN causes the signal on node 71 to be a digital logic high. The signals on nodes 72-74 of the first delay line 68, however, have not transitioned yet. The digital logic low signals on nodes 72-74 are supplied onto inputs of AND gates 88, 89 and 90, so these AND gates output digital logic low signals. AND gate 87, however, detects the condition of a digital logic high signal being present on node 71 and digital logic low signals being present on nodes 72, 73 and 74. AND gate 87 therefore outputs a digital logic high signal. Because prior to the low-to-high transition of the input signal HSIN the AND gate 94 was supplying a digital logic high signal onto an input lead of OR gate 95, and because at and following the low-to-high transition of the input signal HSIN the AND gate 87 is supplying a digital logic high signal onto another input lead of OR gate 95, OR gate 95 continues to assert the EN LOW signal high, and the first gate driver 58 continues to be enabled. The value of the input signal HSIN on the input lead 84 of the gate driver 58, however, transitions from low to high, so the signal on the output lead 65 of the gate driver 58 also transitions low to high. The other two gate drivers 59 and 60 are disabled. This condition persists until the signal on node 72 transitions from low to high. At this time, AND gate 87 switches to outputting a digital logic low, but AND gate 88 switches to outputting a digital logic high. Because the signals on all the input leads of OR gate 95 are digital logic low values, OR gate 95 deasserts the EN LOW signal low, thereby disabling gate driver 58. Because the signal HBOUT that is output by AND gate 88 transitions high, OR gate 96 now outputs a digital logic high signal. The signal EN MED is asserted high, and gate driver 59 is enabled. The digital logic value of the input signal HSIN is still high, so when gate driver 59 is enabled, it drives the signal on its output lead 66 to a high voltage. Gate drivers 58 and 60 are disabled. This condition persists until the signal on node 73 transitions from low to high. At this time, AND gate 88 switches to outputting a digital logic low, but AND gate 89 switches to outputting a digital logic high. Because the signals on all the input leads of OR gate 96 are digital logic low values, OR gate 96 deasserts the EN MED signal low, thereby disabling gate driver 59. Because the signal HCOUT that is output by AND gate 89 transitions high, OR gate 97 now outputs a digital logic high signal. The signal EN HIGH is asserted high, and gate driver 60 is enabled. The digital logic value of the input signal HSIN is still high, so when gate driver 60 is enabled, it drives the signal on its output lead 67 to a high voltage. Gate drivers 58 and 59 are disabled. This condition persists until the signal on node 74 transitions from low to high. At this time, AND gate 89 switches to outputting a digital logic low, but AND gate 90 switches to outputting a digital logic high. Because the signals on all the input leads of OR gate 97 are digital logic low values, OR gate 97 deasserts the EN HIGH signal low, thereby disabling gate driver 60. Because the signal HDOUT that is output by AND gate 90 transitions high, OR gate 95 now outputs a digital logic high signal. The signal EN LOW is asserted high, and gate driver 58 is enabled. The digital logic value of the input signal HSIN is still high, so when gate driver 58 is enabled, it drives the signal on its output lead 65 to a high voltage. Gate drivers 59 and 60 are disabled. At this point forward, as long as the signal on node 71 remains at the high digital logic level, AND gate 90 will continue to output a digital logic high signal, and OR gate will continue to output a digital logic high signal, and gate driver 58 will remain enabled and driving a high voltage onto its output lead 65.

Upon the high-to-low transition of the input signal HSIN on input terminal IN 51, the signal output by buffer 82 onto conductor 83 transitions from high to low. The signal on the input lead 84 of gate driver 58 transitions low, so gate driver 58 switches and starts driving a low voltage onto its output lead 65. Gate driver 58 remains enabled despite the signal HAOUT transitioning low, because the AND gate 91 asserts its output signal LAOUT high. The high-to-low transition of the input signal HSIN causes the signal on the inverted input lead of AND gate 91 to transition low. The three signals on the other three input leads of AND gate 91 are still digital logic high signals because the logic levels on the nodes 76, 77 and 78 of the second delay line have not yet transitioned. As a result, AND gate 91 asserts signal LAOUT high. OR gate 95 therefore continues to assert EN LOW to the high digital logic level, and gate driver 58 remains enabled. This condition persists until the signal on node 76 transitions from high to low. At this time, AND gate 91 switches to outputting a digital logic low, but AND gate 92 switches to outputting a digital logic high. Because the signals on all the input leads of OR gate 95 are digital logic low values, OR gate 95 deasserts the EN LOW signal low, thereby disabling gate driver 58. Because the signal LBOUT that is output by AND gate 92 transitions high, OR gate 97 now outputs a digital logic high signal. The signal EN HIGH is asserted high, and gate driver 60 is enabled. The digital logic value of the input signal HSIN is still low, so when gate driver 60 is enabled, it drives the signal on its output lead 67 to a low voltage. Gate drivers 58 and 59 are disabled. This condition persists until the signal on node 77 transitions from high to low. At this time, AND gate 92 switches to outputting a digital logic low, but AND gate 93 switches to outputting a digital logic high. Because the signals on all the input leads of OR gate 97 are digital logic low values, OR gate 97 deasserts the EN HIGH signal low, thereby disabling gate driver 60. Because the signal LCOUT that is output by AND gate 93 transitions high, OR gate 96 now outputs a digital logic high signal. The signal EN MED is asserted high, and gate driver 59 is enabled. The digital logic value of the input signal HSIN is still low, so when gate driver 59 is enabled, it drives the signal on its output lead 66 to a low voltage. Gate drivers 58 and 60 are disabled. This condition persists until the signal on node 78 transitions from high to low. At this time, AND gate 93 switches to outputting a digital logic low, but AND gate 94 switches to outputting a digital logic high. Because the signals on all the input leads of OR gate 96 are digital logic low values, OR gate 96 deasserts the EN MED signal low, thereby disabling gate driver 59. Because the signal LDOUT that is output by AND gate 94 transitions high, OR gate 95 now outputs a digital logic high signal. The signal EN LOW is asserted high, and gate driver 58 is enabled. The digital logic value of the input signal HSIN is still low, so when gate driver 58 is enabled, it drives the signal on its output lead 65 to a low voltage. Gate drivers 59 and 60 are disabled. This condition persists as low as the input signal HSIN remains low.

Within a delay line, the propagation delay through each of the delay elements is set by the capacitance value of the corresponding external Delay Set (DS) timing capacitor. For example, the propagation delay through delay element 98 is increased by increasing the capacitance on DS terminal 52, and is decreased by decreasing the capacitance on DS terminal 52. The propagation delay through delay element 98 is the period P1 illustrated in FIG. 4A. The other delay elements of the delay lines 68 and 69 work in the same fashion. The user of integrated circuit 25 sets the capacitances of the external delay set timing capacitors 33-38 and the values of the gate resistors 27-29 so as to optimize performance of the phase leg circuit 20. The first predetermined order in which the gate drivers are enabled in response to low-to-high input signal transitions (of the signal on input terminal IN 51) and the second predetermined order in which the gate drivers are enabled in response to high-to-low input signal transitions (of the signal on input terminal IN 51) are determined by how the output signals from the state-detecting AND gates 87-94 are coupled to the OR gates 95-97. In other embodiments, other orders are employed. The first and second predetermined orders may be the same or different.

Whereas in the prior art circuit of FIG. 1, the same approximate gate resistance is used to drive the gate of transistor T1 throughout the low-to-high input signal transition when the transistor T1 is being turned on, in the specific embodiment of FIG. 3 multiple different gate resistance resistances are used in a sequence when the transistor T1 is being turned on. During time P1 a low resistance of ten ohms is used in order to keep the overall turn on time of the transistor as short as possible. During time P2 a medium resistance of thirty ohms is used in order to limit the dI/dt through transistor T1. During time P3 a high resistance of one hundred ohms is used in order to limit the dV/dt across transistor T1. During time P4 a low resistance of ten ohms is used in order to promote fast settling. The time periods P1, P2 and P3 are 120 nanoseconds, 100 nanoseconds, and 50 nanoseconds, respectively.

In the prior art circuit of FIG. 1 a large enough resistance to tailor the dV/dt of the voltage waveform $V_{T1}$ between time t3 and time t4 could not be used because such a large resistance would overly affect and decrease the dI/dt of the current waveform $I_{T1}$ between times t2 and t3. With the novel gate driver integrated circuit 25, however, the effective gate resistances used during these different time portions of the turn on cycle can be set independently. Due to the ability to independently set the effective gate resistance used during these two periods of a turn on episode, a large enough effective gate resistance can be used between times t3 and t4 to waveshape the falling edge of the $V_{T1}$ voltage waveform, and this can be done without overly slowing the current rise of the $I_{T1}$ waveform between times t2 and t3.

Whereas in the prior art circuit of FIG. 1, the same approximate gate resistance is used to drive the gate of transistor T1 throughout the high-to-low input signal transition when the transistor T1 is being turned off, in the specific embodiment of FIG. 3 multiple different gate resistor resistances are used in a sequence when the transistor T1 is being turned off. During time P5 a low resistance of ten ohms is used in order to keep the overall turn off time of the transistor as short as possible. During time P6 a high resistance of one hundred ohms is used in order to limit the dV/dt across the transistor T1. During time P7 a medium resistance of thirty ohms is used in order to limit the dI/dt through the transistor T1. During time P8 a low resistance of ten ohms is used to ensure safe turn off and to ensure that transistor T1 remains off. The time periods P5, P6 and P7 are 200 nanoseconds, 175 nanoseconds, and 300 nanoseconds, respectively. Again, an adequately high effective gate resistance can be used during the time between times t6 and t7 to waveshape the rising edge of the voltage waveform $V_{T1}$, while at the same time using a somewhat smaller effective gate resistance that does not unduly decrease the rate at which the current $I_{T1}$ drops between times t7 and t8.

Figure 6:
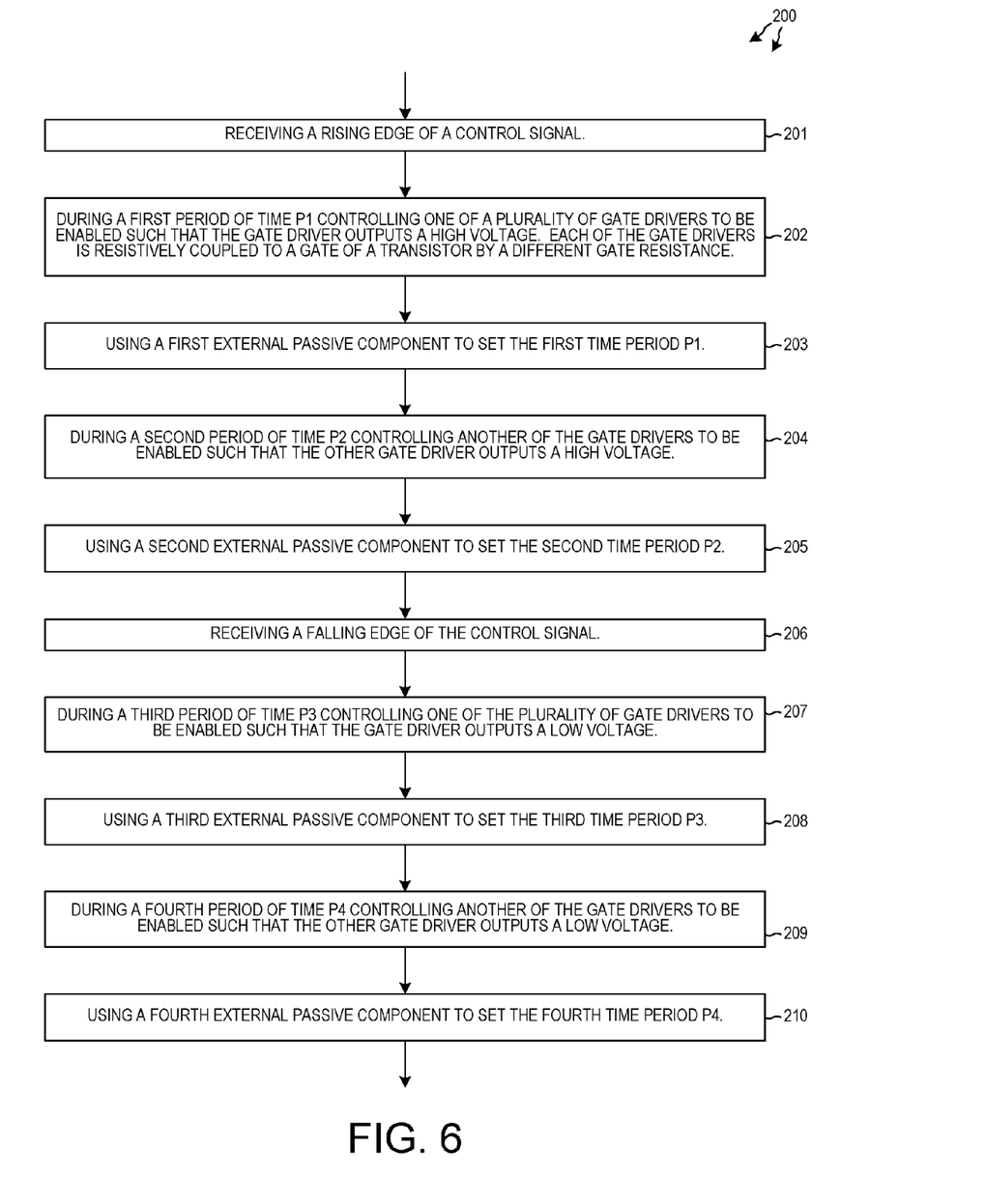
FIG. 6 is a flowchart of a method involving a novel gate driver integrated circuit in accordance with one novel aspect.

FIG. 6 is a flowchart of a method 200 in accordance with one novel aspect. A rising edge of the input signal HSIN is received (step 201) onto input terminal IN 51 of the gate driver integrated circuit. During a first period of time P1, a first of a plurality of gate drivers is enabled (step 202) such that the enabled gate driver drives the gate of transistor T1 with a first effective gate resistance. Each of the gate drivers is resistively coupled to the same gate of the same transistor T1 via a different gate resistance. A first external passive circuit component is used (step 203) by the gate driver integrated circuit to set the time period P1. After time period P1 there is a second time period P2. During time period P2, a second of the plurality of gate drivers is enabled (step 204). The enabled gate driver drives the gate of the transistor T1 with a second effective gate resistance. A second external passive circuit component is used (step 205) by the gate driver integrated circuit to set the time period P2. The second time period P2 may be followed by other time periods in which various ones of the gate drivers are enabled such that the gate of the transistor is driven with a different effective gate resistance during each of the time periods. A falling edge of the input signal HSIN is then received (step 206) onto input terminal IN 51 of the gate driver integrated circuit. During a third period of time P3, one of gate drivers is enabled (step 207) such that the enabled gate driver drives the gate of transistor T1 with an effective gate resistance. A third external passive circuit component is used (step 208) by the gate driver integrated circuit to set the time period P3. During time period P4, another of the gate drivers is enabled (step 209). The enabled gate driver drives the gate of the transistor T1 with another effective gate resistance. A fourth external passive circuit component is used (step 210) by the gate driver integrated circuit to set the time period P4. The fourth time period P4 may be followed by yet other time periods in which various ones of the gate drivers are enabled such that the gate of the transistor is driven with a different effective gate resistance during each of these time periods.

In some examples of the method 200, one and only one of the gate drivers is enabled at a given time. In other examples of the method 200, multiple ones of the gate drivers are simultaneously enabled during some of the time periods. The time periods are at least in part set by the external passive components, but in some embodiments the time periods are adjusted by other circuitry. For example, in one embodiment the buffers of the delay lines that set the various time periods are current starved to various degrees as a function of the temperature of the gate driver integrated circuit. Circuit operation over a temperature range is monitored, and then the current starve control of the buffers as a function of temperature is set so that the various effective gate resistances are used at the proper times in the turn on and in the turn off episodes of the transistor, regardless of what the temperature of the circuit is within that temperature range.

In one example the gate driver integrated circuit described above has a digital serial bus interface (for example, I2C bus interface) through which it communicates with a microcontroller or power supply control circuit. Via this bus, the microcontroller or power supply control circuit can write to a set of internal digital control registers within the gate driver integrated circuit. The value in a first control register sets the first predetermined order to be one of a plurality of selectable orders, and another value in a second control register sets the second predetermined order to be one of the plurality of selectable orders. In one example, the values stored in the control registers are supplied as input signals to a second example of the logic 70 of FIG. 5. Multiple sets of the AND gates 87-90 may be provided in logic 70, where which set of these AND gates is active is determined the value in the first control register. Likewise, multiple sets of AND gates 91-94 may be provided, where which set of these AND gates is active is determined by the value in the second control register. The number of buffers in the two delay lines of the circuit of FIG. 5 is increased, and the corresponding larger number of delay set capacitors is packaged in the semiconductor device package along with the integrated circuit itself. The microcontroller can then over time fine tune and modify how the modified gate driver integrated circuit of FIG. 5 drives the IGBT as the larger phase leg circuit of which the IGBT is a part operates.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. An integrated circuit comprising:
   a first power transistor gate driver having an output lead;
   a second power transistor gate driver having an output lead;
   a third power transistor gate driver having an output lead;
   a signal node, wherein a gate driver control signal is present on the signal node, wherein the gate driver control signal is a digital signal that has a rising edge that is followed by a falling edge; and
   a driver control circuit that receives the gate driver control signal and in response to the rising edge enables the first, second and third power transistor gate drivers sequentially in a first predetermined order, wherein each of the three power transistor gate drivers when enabled in response to the rising edge drives a high voltage onto its output lead, wherein the driver control circuit in response to the falling edge enables the first, second and third power transistor gate drivers sequentially in a second predetermined order, and wherein each of the three power transistor gate drivers when enabled in response to the falling edge drives a low voltage onto its output lead when it is enabled.

2. The integrated circuit of claim 1, further comprising:
   a first output integrated circuit package terminal, wherein the output lead of the first power transistor gate driver is coupled to the first output integrated circuit package terminal;
   a second output integrated circuit package terminal, wherein the output lead of the second power transistor gate driver is coupled to the second output integrated circuit package terminal; and
   a third output integrated circuit package terminal, wherein the output lead of the third power transistor gate driver is coupled to the third output integrated circuit package terminal.

3. The integrated circuit of claim 2, further comprising:
   an input signal integrated circuit package terminal, wherein the gate driver control signal is received by the integrated circuit onto the input signal integrated circuit package terminal.

4. The integrated circuit of claim 1, wherein only one of the power transistor gate drivers is enabled at a time when the first, second and third power transistor gate drivers are sequentially enabled in the first predetermined order, and wherein only one of the power transistor gate drivers is enabled at a time when the first, second and third power transistor gate drivers are sequentially enabled in the second predetermined order.

5. The integrated circuit of claim 1, wherein the first predetermined order is an enabling of the second power transistor gate driver, then an enabling of the third power transistor gate driver, and then an enabling of the first power transistor gate driver, and wherein the second predetermined order is an enabling of the third power transistor gate driver, then an enabling of the second power transistor gate driver, and then an enabling of the first power transistor gate driver.

6. The integrated circuit of claim 1, wherein each of the first, second and third power transistor gate drivers if not enabled by the driver control circuit is disabled, and wherein if a power transistor gate driver is disabled then it is not driving either a high voltage or a low voltage onto its output lead.

7. An integrated circuit comprising:
a first power transistor gate driver having an output lead;
a second power transistor gate driver having an output lead;
a third power transistor gate driver having an output lead;
a digital input signal node adapted to receive a digital gate driver control signal so that the digital gate driver control signal is present on the digital input signal node, wherein the digital gate driver control signal has a rising edge that is followed by a falling edge, and wherein the rising edge and the falling edge are two consecutive edges; and
a driver control circuit adapted to receive the digital gate driver control signal and in response to the rising edge to enable the first, second and third power transistor gate drivers sequentially in a first predetermined order, wherein each of the three power transistor gate drivers if enabled in response to the rising edge drives a high voltage onto its output lead, wherein the driver control circuit is also adapted to enable the first, second and third power transistor gate drivers sequentially in a second predetermined order in response to the falling edge, wherein each of the three power transistor gate drivers if enabled in response to the falling edge drives a low voltage onto its output lead when it is enabled, and wherein the driver control circuit is adapted to disable a power transistor gate driver if that power transistor gate driver is not enabled by the driver control circuit.

8. The integrated circuit of claim 7, further comprising:
a first output integrated circuit package terminal, wherein the output lead of the first power transistor gate driver is coupled to the first output integrated circuit package terminal;
a second output integrated circuit package terminal, wherein the output lead of the second power transistor gate driver is coupled to the second output integrated circuit package terminal; and
a third output integrated circuit package terminal, wherein the output lead of the third power transistor gate driver is coupled to the third output integrated circuit package terminal.

9. The integrated circuit of claim 8, further comprising:
an input signal integrated circuit package terminal, wherein the gate driver control signal is received by the integrated circuit onto the input signal integrated circuit package terminal.

10. The integrated circuit of claim 7, wherein only one of the power transistor gate drivers is enabled at a time when the first, second and third power transistor gate drivers are sequentially enabled in the first predetermined order, and wherein only one of the power transistor gate drivers is enabled at a time when the first, second and third power transistor gate drivers are sequentially enabled in the second predetermined order.

11. The integrated circuit of claim 7, wherein in response to the rising edge of the gate driver control signal the first power transistor gate driver is enabled for a predetermined amount of time after the rising edge of the gate driver control signal, further comprising:
a delay set integrated circuit package terminal adapted to be coupled to an external electrical component such that the predetermined amount of time is determined at least in part by the external electrical component.

12. An integrated circuit comprising:
a first gate driver;
a second gate driver;
a third gate driver;
a first delay set terminal adapted to couple to a first external component external to the integrated circuit;
a second delay set terminal adapted to couple to a second external component external to the integrated circuit; and
a driver control circuit that receives a gate driver control signal and in response to a rising edge of the gate driver control signal enables the first, second and third gate drivers sequentially in a first predetermined order, wherein each of the three gate drivers when enabled in response to the rising edge drives a high voltage signal, wherein in response to the rising edge the first gate driver is disabled a first predetermined amount of time after the rising edge, wherein in response to the rising edge the second gate driver is disabled a second predetermined amount of time after the first gate driver is disabled, wherein the driver control circuit also couples to the first external component such that the first external component at least in part determines the first predetermined amount of time, and wherein the driver control circuit also couples to a second external component such that the second external component at least in part determines the second predetermined amount of time.

13. The integrated circuit of claim 12, wherein each of the first, second and third gate drivers is a driver of a power transistor.

14. The integrated circuit of claim 12, further comprising:
a first driver output terminal, wherein an output of the first gate driver is coupled to drive the first driver output terminal;
a second driver output terminal, wherein an output of the second gate driver is coupled to drive the second driver output terminal; and
a third driver output terminal, wherein an output of the third gate driver is coupled to drive the third driver output terminal.

15. The integrated circuit of claim 14, further comprising:
a third delay set terminal adapted to couple to a third external component external to the integrated circuit; and
a fourth delay set terminal adapted to couple to a fourth external component external to the integrated circuit, wherein the driver control circuit is adapted to enable the first, second and third gate drivers sequentially in a second predetermined order in response to a falling edge of the gate driver control signal, wherein the driver control circuit is adapted to couple to the third external component such that the third external component at least in part determines an amount of time that one of the gate drivers is enabled after the falling edge, and wherein the driver control circuit is adapted to couple to the fourth external component such that the fourth external component at least in part determines an amount of time that another one of the gate drivers is enabled after said one gate driver is disabled after the falling edge.

16. A circuit comprising:
a power transistor having a control electrode;
a first power transistor gate driver;
a first resistor that couples an output of the first power transistor gate driver to the control electrode of the power transistor;

a second power transistor gate driver;
a second resistor that couples an output of the second power transistor gate driver to the control electrode of the power transistor;
a third power transistor gate driver;
a third resistor that couples an output of the third power transistor gate driver to the control electrode of the power transistor; and
a control circuit that receives a gate driver control signal and in response to a rising edge of the gate driver control signal enables the first, second and third power transistor gate drivers sequentially in a first predetermined order, wherein the control circuit also enables the first, second and third power transistor gate drivers sequentially in a second predetermined order in response to a falling edge of the gate driver control signal.

17. The circuit of claim 16, further comprising:
a first passive component coupled to the control circuit, wherein the first passive component at least in part determines a period of time that the first power transistor gate driver is enabled following the rising edge; and
a second passive component coupled to the control circuit, wherein the second passive component at least in part determines a period of time that the second power transistor gate driver in response to the rising edge is enabled following a disabling of the first power transistor gate driver.

18. The circuit of claim 16, wherein the first predetermined order is different than the second predetermined order.

19. The circuit of claim 16, wherein the control circuit controls the first, second and third power transistor gate drivers such that at most one of the power transistor gate drivers is enabled at a time.

20. The circuit of claim 16, wherein the control circuit controls the first, second and third power transistor gate drivers such that during some periods of time more than one of the power transistor gate drivers are enabled at a time.

* * * * *